United States Patent [19]
Arakawa et al.

[11] Patent Number: 4,701,317
[45] Date of Patent: Oct. 20, 1987

[54] HIGHLY ELECTROCONDUCTIVE FILMS AND PROCESS FOR PREPARING SAME

[75] Inventors: Tatsumi Arakawa; Masaru Ozaki; Yukihiro Ikeda, all of Fuji, Japan

[73] Assignee: Director-General of Agency of Industrial Science and Technology, Tokyo, Japan

[21] Appl. No.: 904,823

[22] Filed: Sep. 8, 1986

Related U.S. Application Data

[63] Continuation of Ser. No. 664,031, Oct. 23, 1984, abandoned.

[30] Foreign Application Priority Data

Jun. 14, 1983 [JP] Japan ................................ 58-104961
Dec. 12, 1983 [JP] Japan ................................ 58-232656

[51] Int. Cl.$^4$ ...................... C01B 31/00; C01B 31/02; C01B 31/04; A23L 1/27
[52] U.S. Cl. .................................... 423/445; 423/448; 423/458; 427/249; 428/408; 428/938

[58] Field of Search ...................... 423/448, 458, 445; 427/249; 428/408, 938

[56] References Cited

U.S. PATENT DOCUMENTS 4,609,972 9/1986 Edeling et al. ...................... 423/448

OTHER PUBLICATIONS

Physics of Semiconductor Devices, S. M. Sze, pp. 30–33.

Primary Examiner—John Doll
Assistant Examiner—Lori S. Freeman
Attorney, Agent, or Firm—Cushman, Darby & Cushman

[57] ABSTRACT

A highly electroconductive carbonaceous film having an electrical conductivity of at least about 1000 s/cm is prepared by thermally decomposing a diethynylbenzene in a carrier gas composed of an inert gas at a temperature of about 950° C. to about 1050° C.

16 Claims, No Drawings

HIGHLY ELECTROCONDUCTIVE FILMS AND PROCESS FOR PREPARING SAME This is a continuation of application Ser. No. 664,031, filed Oct. 23, 1984, which was abandoned upon the filing hereof.

BACKGROUND OF THE INVENTION (1) Field of the Invention

This invention relates to an electroconductive film and a process for the preparation thereof.

(2) Description of the Prior Art

As means for obtaining a carbonaceous electroconductive film, the gas phase thermal decomposition of an aliphatic hydrocarbon such as methane or ethane or an aromatic hydrocarbon such as benzene has been hitherto considered important. Many processes have been proposed on the basis of this gas phase thermal decomposition, however, the reaction temperature is high, i.e., generally in the range of from 1000° C. to 3300° C., and the consumption of energy is extremely large. Furthermore, at lower temperatures falling within this range, it is difficult to obtain a highly electroconductive film.

SUMMARY OF THE INVENTION

In view of the foregoing, it is the primary object of the present invention to provide a film having a sufficiently high electric conductivity which can be prepared advantageously even at a relatively low heating temperature.

In one aspect of the present invention, there is provided a highly electroconductive film having an electrical conductivity of at least about 1000 S/cm, which is obtained by thermally decomposing a diethynylbenzene in a carrier gas composed of an inert gas.

In another aspect of the present invention, there is provided a process for preparing a highly electroconductive film having an electrical conductivity of at least about 1000 S/cm, which comprises thermally decomposing a diethynylbenzene in a carrier gas composed of an inert gas at a temperature of about 950° C. to about 1050° C. Preferably, the thus obtained film is heat-treated at a temperature of at least about 2000° C.

DESCRIPTION OF THE PREFERRED EMBODIMENTS

The highly electroconductive film of the present invention broadly includes not only a film having a high electrical conductivity comparable to that of a metal but also a film having an electrical conductivity of the semiconductor region. This film may be used alone or as a covering layer for heat-resistant materials, carbon, ceramics, and metals.

The diethynylbenzene used includes three isomers, that is, ortho-, meta- and para-diethynylbenzenes. To obtain an especially highly electroconductive film, it is preferred that para-diethynylbenzene be used. A mixture of two or more of these isomers may be used. Moreover, the diethynylbenzene used in the present invention may be used as a mixture which contains about 5 to about 50% by volume of an aliphatic hydrocarbon such as methane or ethane, an alicyclic hydrocarbon such as cylcohexane or cyclohexene, an aromatic hydrocarbon such as benzene or chlorobenzene, or an unsaturated hydrocarbon such as ethylene or acetylene.

To facilitate introduction of the diethynylbenzene together with a carrier gas into a heating atmosphere, the diethynylbenzene may be pre-heated at a temperature close to or higher than the melting point thereof. It is preferred that the diethynylbenzene be introduced into a heating atmosphere in the state where the diethynylbenzene is diluted to a concentration of about 1 to about 50%, especially about 5 to about 20%, by a carrier gas.

As the carrier gas used in the present invention, there can be mentioned rare gases such as helium and argon and inert gases such as nitrogen gas. Hydrogen can also be used instead of these inert gases. The flow rate of the carrier gas is about 0.01 to about 5 l/min, preferably about 0.05 to about 1 l/min, if the inner diameter of a cylinder is, for example, 40 mm.

By introducing the above-mentioned starting gas containing a diethynylbenzene into a heating atmosphere maintained at a temperature of at least about 500° C., preferably at a temperature of about 950° C. to about 1050° C., a highly electroconductive film having an electrical conductivity of at least about 1000 S/cm is obtained. Any of an external heating method utilizing an electric furnace or induction heating, and an electric heating method for heating a substrate per se by applying electricity to the substrate may be adopted. A heating time of scores of minutes to about 100 minutes is sufficient for obtaining a highly electroconductive film having a thickness of about 1 $\mu$m. The thickness of the film is determined relative to the flow rate of the carrier gas, and the heating time can be further shortened by adjusting the flow rate of the carrier gas.

The film thus obtained by thermal decomposition is characterized in that it has the properties of soft carbon, that is, an easily graphitizable carbon material. If the obtained film is heat-treated at a high temperature of at least about 2000° C., preferably at a temperature of about 3000° C. to about 3300° C., the graphitization of the carbon is advanced and a highly electroconductive film having an electric conductivity of $1 \times 10^4$ to $2.5 \times 10^4$ S/cm can be obtained.

The electroconductive film obtained according to the process of the present invention can be used as a surface covering layer for various heat-resistant materials. More specifically, the electroconductive film may be used for covering inorganic materials such as quartz, glass, boron nitride, silicon nitride, aluminum oxide, silicon, germanium, indium-antimony, and gallium-arsenic; metal materials such as iron, copper, aluminum, nickel, and stainless steel; and carbon materials such as graphite, graphite fiber, carbon fiber, and carbon powder. Furthermore, the highly electroconductive film of the present invention may be used for crystalline bases for epitaxial polymerization, such as NaCl and KBr, and for bases for graphoepitaxial growth such as grating.

In the foregoing embodiment, no catalyst is used. Of course, the process of the present invention includes an embodiment using a catalyst. As the catalyst, there can be used metals such as iron, cobalt and nickel, and chlorides, oxides, acidic salts, and basic salts thereof.

The electrical conductivity of the electroconductive film of the present invention can be enhanced by doping and intercalation. As the dopant and intercalant, there may be used know substances proposed for polyacetylene and graphite, such as $AsF_5$, $SbF_5$, $SO_3$, $FeCl_3$, K, and Na. The process of the present invention is characterized in that a diethynylbenzene is used as the starting material to be thermally decomposed. According to the present invention, a film having a sufficiently high electrical conductivity can be prepared at a relatively low heating temperature.

Since the film of the present invention has not only a high electrical conductivity but also an excellent chemical resistance, if the film of the present invention is formed on an ordinary substrate of a metal, ceramic material or glass, the film can be utilized as an anti-corrosive electrode. Furthermore, since the film of the present invention is composed substantially of graphite, this film is valuable as a graphite material and is expected to be broadly used as a highly electroconductive film material in the field of electronics.

The present invention will now be described in detail with reference to the following examples.

EXAMPLE 1

A square quartz or alumina substrate having a size of 18 mm×18 mm was placed in a quartz or alumina reaction tube having an inner diameter of 40 mm. The reaction tube was heated at a temperature described below in an electric furnace. Then, p-diethynylbenzene preliminarily heated at 90° C. was introduced into the heated reaction tube for 60 minutes together with argon as a carrier gas. The flow rate of the gas was 0.5 l/min, and p-diethynylbenzene was diluted to about 10% by the carrier gas. As the result, a bright black electroconductive film having a thickness of about 0.6 μm was obtained on the quartz or alumina substrate. The electrical conductivity of the film was determined according to the four-terminal method. The obtained results and the heating temperatures in the electric furnace are shown below.

| Heating Temperature (°C.) | Electrical Conductivity (S/cm) |
|---|---|
| 500 | 0.6 |
| 700 | 50 |
| 900 | 700 |
| 1000 | 3300 |
| 1200 | 1100 |
| 1400 | 800 |
| 2000 | 700 |

When the quartz substrate covered with the highly electroconductive film formed at a heating temperature of 2000° C. was compared as an electrode with an ordinary carbon electrode, it was seen that the electric conductivity of this electrode was about 10 times as high as that of the carbon electrode and the resistance to a strong acid or strong alkali was several times as high as that of the carbon electrode.

EXAMPLE 2

A bright black electroconductive film having thickness of about 0.4 μm was prepared on a quartz substrate in the same manner as described in Example 1 except that m-diethynylbenzene was used instead of p-diethynylbenzene, the gas flow rate was 0.3 l/min and the concentration of m-diethynylbenzene in the carrier gas was 15%. The relationship between the electric conductivity and the heating temperature was as shown below.

| Heating Temperature (°C.) | Electrical Conductivity (S/cm) |
|---|---|
| 500 | 0.4 |
| 700 | 20 |
| 900 | 500 |
| 1000 | 2000 |
| 1200 | 900 |
| 1400 | 600 |
| 2000 | 500 |

EXAMPLE 3

An electroconductive film having a thickness of 10 μm was prepared on a silicon wafer in the same manner as described in Example 1 except that the heating temperature was 1000° C. and the heating time was 10 hours. The formed film was peeled from the silicon wafer and was heat-treated at 3000° C. in an argon current in a super-high temperature furnace for 2 hours. When the electrical conductivity of the treated film was determined according to the four-terminal method, it was found that the electrical conductivity was $2 \times 10^4$ S/cm. If this film was compared as an electrode plate with an ordinary carbon electrode, it was found that the corrosion resistance to a strong acid or strong alkali was several times as high as that of the carbon electrode.

We claim:

1. A highly electroconductive carbonaceous film having an electrical conductivity of at least 1000 S/cm, which is obtained by thermally decomposing a diethynylbenzene in a carrier gas composed of an inert gas.

2. A highly electroconductive carbonaceous film according to claim 1, wherein the thermal decomposition is carried out at a temperature of about 950° C. to about 1050° C. and the diethynylbenzene is p-diethynylbenzene.

3. A process for preparing a highly electroconductive carbonaceous film having an electrical conductivity of at least about 1000 S/cm which comprises thermally decomposing a diethynylbenzene in a carrier gas composed of an inert gas at a temperature of about 950° C. to about 1050° C.

4. A process according to claim 3, wherein the diethynylbenzene is p-diethynylbenzene.

5. A process according to claim 4, wherein the resulting highly electroconductive carbonaceous film is heat-treated at a temperature of about 2000° C. to about 3300° C.

6. A highly electroconductive carbonaceous film according to claim 2 having an electrical conductivity of $1 \times 10^4$ to $2.5 \times 10^4$ S/cm, said film being obtained by heat-treating said film at a temperature of at least about 2,000° C. to about 3,300° C.

7. A highly electroconductive carbonaceous film according to claim 1 wherein said film contains a dopant selected from the group consisting of $AsF_5$, $SbFe_5$, $SO_3$, $FeCl_3$, K, and Na.

8. A highly electroconductive carbonaceous film according to claim 1 wherein said film has a thickness of about 1 μm.

9. A highly electroconductive carbonaceous film according to claim 1, wherein said film covers at least one surface of a substrate selected from the group consisting of quartz, glass, boron nitride, silicon nitride, aluminum oxide, silicon, germanium, indium-antimony, gallium-arsenic, iron, copper, aluminum, nickel, stainless steel graphite, graphite fiber, carbon fiber and carbon powder.

10. A process according to claim 4, wherein said film is heat treated at a temperature of about 3000° C. to about 3300° C.

11. A process for producing a highly electroconductive carbonaceous film having electrical conductivity of at least 100 S/cm consisting essentially of:
(a) providing a contained atmosphere heated to between about 950° C. to 1050° C.;
(b) providing a substrate in said contained atmosphere;
(c) introducing a gas consisting essentially of diethynylbenzene and a carrier into said contained heated atmosphere whereby said diethynylbenzene decomposes and a highly conductive carbonaceous film forms on said substrate; and
(d) heat treating said thus formed film at a temperature of at least about 2000° C. whereby graphitization of said film is advanced and a highly electroconductive film having an electroconductivity of $1 \times 10^4$ to $2.5 \times 10^4$ S/cm is obtained.

12. A process according to claim 11, wherein said diethynylbenzene is diluted with said inert gas to a concentration of about 1% to about 50% and wherein said inert gaas is selected from the group consisting of helium, argon, and nitrogen.

13. A process according to claim 11 wherein the decomposition of the diethynylbenzene is conducted in the presence of a catalyst.

14. A process according to claim 11 wherein the diethynylbenzene is decomposed in the presence of a dopant selected from the group consisting of $AsS_5$, $SbF_5$, $SO_3$, ferric chloride, potassium and sodium.

15. A process according to claim 11 wherein said diethynylbenzene is p-diethynylbenzene.

16. A process according to claim 11 wherein said substrate is selected from the group consisting of: quartz, glass, boron nitride, silicon nitride, aluminum oxide, silicon, germanium, gallium-arsenic, iron, copper, aluminum, nickel, stainless steel graphite, graphite fiber, carbon fiber, and carbon powder.

* * * * *